United States Patent [19]
Goldberg

[11] Patent Number: 5,351,038
[45] Date of Patent: Sep. 27, 1994

[54] QUICK TRIP CIRCUIT BREAKER LOCATOR

[76] Inventor: Arnold Goldberg, 1519 Elmary Pl., Fairlawn, N.J. 07410

[21] Appl. No.: 997,347

[22] Filed: Dec. 28, 1992

[51] Int. Cl.⁵ ............................................ G08B 21/00
[52] U.S. Cl. .................................. 340/644; 324/424
[58] Field of Search ............... 324/133, 149, 508, 512, 324/522, 527, 528, 556, 537, 415, 424; 340/638, 649, 644; 361/115, 1

[56] References Cited

U.S. PATENT DOCUMENTS

| | | | |
|---|---|---|---|
| 3,898,557 | 8/1975 | Strock | 324/508 |
| 3,922,600 | 11/1975 | Roveti | 324/133 |
| 4,280,092 | 7/1981 | Wells, Jr. et al. | 324/133 |
| 4,725,772 | 2/1988 | Peak | 324/133 |

*Primary Examiner*—A. D. Pellinen
*Assistant Examiner*—Sally C. Medley
*Attorney, Agent, or Firm*—Richard A. Joel

[57] ABSTRACT

A circuit breaker locator comprises a housing having a plunger projecting outwardly at one end and reciprocably moveable within the housing. The plunger is coupled to a spring urged retractable contact at the opposite end of the housing. The housing also includes, at the end with the retractable contact, a pair of contacts extending outwardly therefrom which are coupled to a fuse and a pilot light connected in parallel with the fuse. In operation, the pair of contacts are inserted into an electrical outlet and the plunger is actuated forcing the retractable ground contact into the outlet. The device automatically trips a circuit breaker related to the particular outlet so that it is possible to check which circuit breaker is connected to the outlet. If the breaker fails to trip, the alarm light, which is connected parallel with the fuse, is activated indicating a faulty circuit breaker. The circuit breaker locator provides a ready and safe means of determining what circuit breaker is related to what outlet.

6 Claims, 2 Drawing Sheets

QUICK TRIP CIRCUIT BREAKER LOCATOR

BACKGROUND OF THE INVENTION

The circuit breaker locator of the present invention comprises a convenient portable fuse device which automatically trips the circuit breaker related to the particular outlet to which the device is connected. The device permits one to find out what breaker controls a circuit without time consuming trial and error.

The prior art includes U.S. Pat. No. 4,858,054 to Franklin which discloses protective circuits and, in particular, a novel circuit breaker cartridge, an adapter for insertion into a receptacle, a receptacle and a connecting plug, each comprising a triac and a current sensing impedance which function to actuate a circuit breaker or fuse for protection against short circuit fires.

U.S. Pat. No. 3,939,130 to Graham discloses a plug-in fuse receptacle interchangeable with a circuit breaker while U.S. Pat. No. 3,214,532 to Konynenberg describes a plug socket switch combination. Finally, U.S. Pat. No. 3,163,728 to Martin discloses a combination safety socket and switch.

None of the foregoing patents disclose the structure of the present invention or have the same use, that of relating electrical outlets to particular circuit breakers.

SUMMARY OF THE INVENTION

This invention relates to electrical devices and particularly to a device for determining what electrical outlets are connected to what circuit breakers. In other words, the invention comprises a circuit breaker locator which is inserted into an outlet to activate the breaker related to the particular outlet. This saves considerable time in locating the breaker and is a positive safety feature.

The circuit breaker locator comprises a housing with a plunger coupled to a spring-urged contact at one end of housing. The plunger projects outwardly from the housing and upon actuation forces the contact into the ground outlet of a three prong outlet. The finder includes a fuse within the housing connected between a pair of contacts. The high fuse rating permits the finder to operate the related circuit breaker so that the appropriate circuit breaker can be determined. If the circuit breaker fails to operate, the fuse blows and a warning light goes on.

Accordingly, it is an object of this invention to provide a new and improved circuit breaker locator and circuit breaker tester.

Another object of this invention is to provide a new and improved electrical device which is connected to an outlet to activate a circuit breaker related to the particular outlet.

A further object of this invention is to provide a unique inexpensive plunger actuated device which is inserted into an outlet to activate a circuit breaker related to the outlet.

A more specific object of this invention is to provide a new and improved circuit breaker locator which includes contacts having a fuse coupled therebetween within a housing and a retractable contact which is forced into an outlet by the plunger to operate and locate the related circuit breaker, and warning means to indicate the circuit breaker is inoperative and the fuse has blown.

BRIEF DESCRIPTION OF THE DRAWINGS

The foregoing and other objects and advantages of the present invention may be more clearly seen when viewed in conjunction with the accompanying drawings wherein.

DETAILED DESCRIPTION OF THE INVENTION

Figure 1:
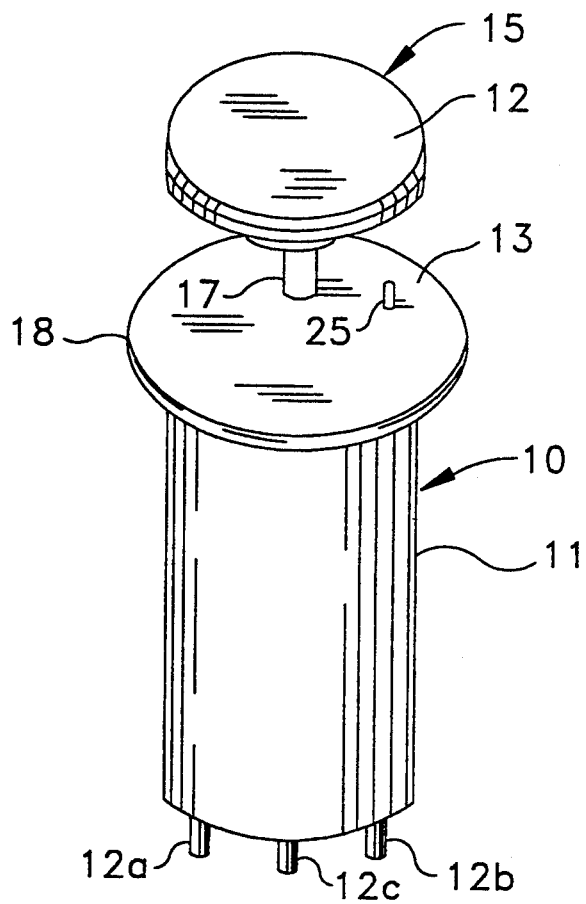
FIG. 1 is a perspective view of the circuit breaker locator comprising the present invention.

Referring now to the drawings, the invention comprises a circuit breaker locator 10 including a substantially cylindrical housing 11, an activating plunger 15 extending outwardly from the cover 13 at one end and a plurality of contacts 12a, 12b and 12c extending outwardly from the base 14 at the other end. The removeable cover 13 includes an aperture 16 within which the stem 17 of plunger 15 is slidable. The cover 13 also includes a warning light 25 projecting outwardly therefrom and downwardly extending outer portions 18 which engage the walls of the housing 11 to maintain the cover 13 in place.

Figure 2:
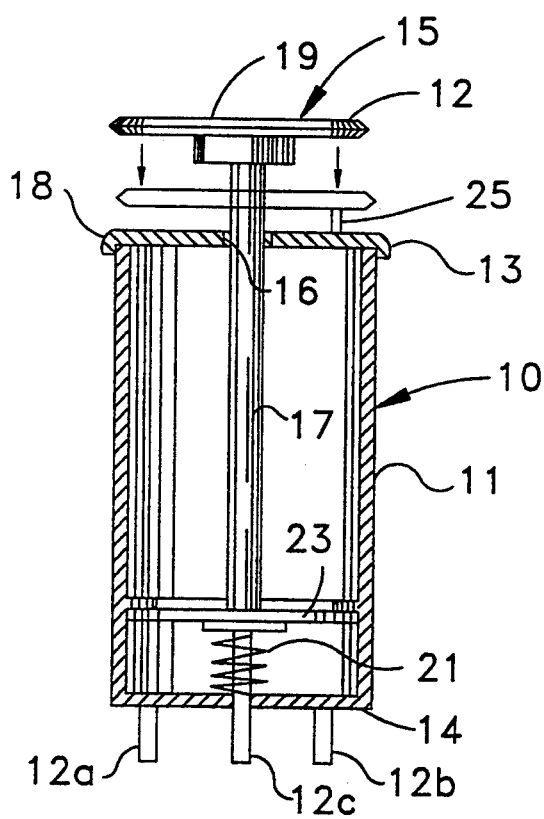
FIG. 2 is a cutaway view of the invention showing the internal structure of the invention.

The plunger 15 includes a handle 19 mounted on the stem 17 to permit an operator to push the spring backed plunger 15 inwardly. As shown in FIG. 2, the non-conductive stem 17 of the plunger 15 engages a spring 21 within the housing 11 which urges the plunger 15 outwardly. The bottom 22 of the stem 17 is mounted to a transverse member 23 which is moveable along the internal walls 24 of the plunger 17. A ground contact 12c is mounted to the bottom 25 of the transverse member with spring 21 mounted thereabout. The spring 21 engages the transverse member 23 at one end and the base 14 at its other end urging the contact 12c into a normally retracted position.

Figure 3:
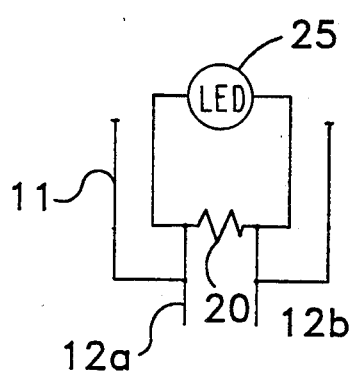
FIG. 3 is an electrical schematic illustrating the circuit mounted within the housing.

As shown in FIG. 3, contacts 12a and 12b are connected within the housing 11 to a fuse 20 which would normally be approximately 50 amps. A warning light 25 is connected to the contacts 12 to light if the circuit breaker fails to operate. In some cases circuit breakers become frozen or inoperative and the light 25 gives notice of this fact when the replaceable fuse 20 blows. The fuse 20 may be readily replaced by merely removing the cover 13.

Figure 4:
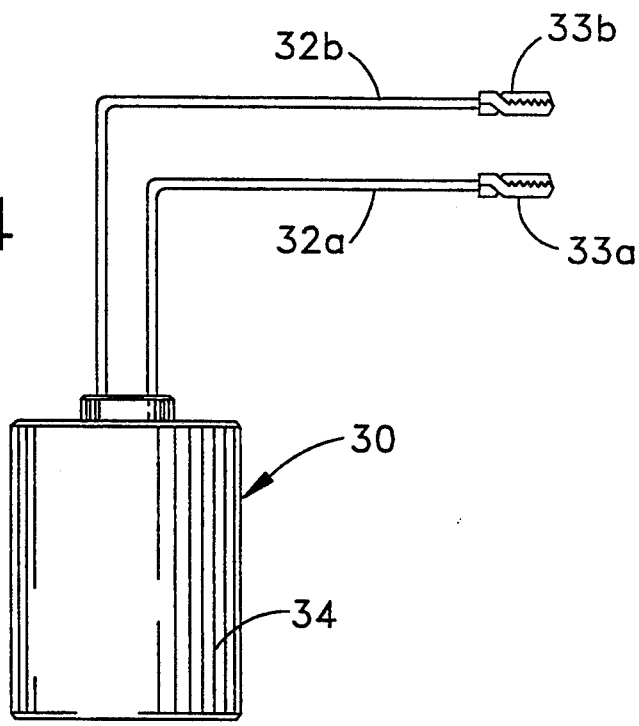
FIG. 4 is a side view of an adapter used with the circuit breaker locator disclosed herein, and, FIG. 5 is a side view of an adaptor being used with the circuit breaker locator.
Figure 5:
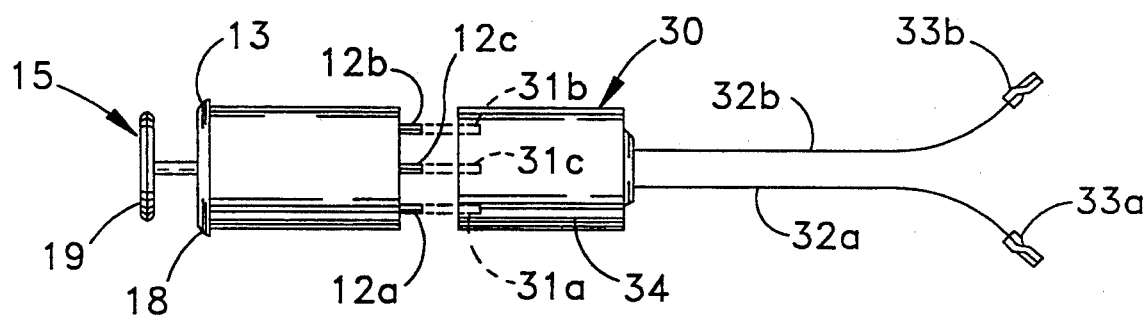

As shown in FIG. 5, a quick trip adaptor or "Gazinta" 30 may be used with the locator 10. The adaptor 30 comprises a cylindrical female connector with receptacles 31a-c for the outlet prongs 12a-c on the locator 10. The adaptor includes a pair of insulated test leads 32a and 32b which extend outwardly from the end of the housing 34 opposite the receptacles 31a-c and terminate in alligator clips 33a and 33b. The adaptor is also shown in FIG. 4.

In operation, the circuit breaker locator 10 is positioned over the outlet with contacts 12a and 12b inserted into the receptacle. The plunger 15 is then depressed forcing contact 12c into the receptacle. The circuit breaker related to the outlet operates permitting one to rapidly determine what outlet is connected to what circuit breaker without costly trial and error. The circuit breaker locator 10 also promotes safety since an individual may be certain that the power to a particular outlet is off.

When the adaptor is used with 120 volt circuits, the locator 10 is coupled to the adapter 30, the alligator clips 33a–b placed on exposed leads (not shown) and the plunger 15 is depressed. This causes the breaker to trip indicating what breaker corresponds to that line. If the light 25 operated, then the fuse in the quick trip locator has blown indicating a problem with the breaker.

While the invention has been explained by a detailed description of certain specific embodiments, it is understood that various modifications and substitutions can be made in any of them within the scope of the appended claims which are intended also to include equivalents of such embodiments.

What is claimed is:

1. A circuit breaker locator for use with circuits having a plurality of receptacles and corresponding circuit breakers comprising:
   a housing having an elongated body portion and a transverse cover portion at each end,
   a plunger extending outwardly through the cover from one end of the housing and axially within the housing, said plunger being reciprocably moveable within said housing,
   resilient means engaging the plunger within the housing to maintain the plunger in a predetermined position within said housing,
   a pair of electrical contacts for insertion into a receptacle and a ground contact extending outwardly from the other end of the housing wherein the ground contact is coupled to the plunger within the housing said plunger being actuated to thereby move the ground contact outwardly from the housing, and
   a fuse having a higher rating than the corresponding circuit breaker for the outlet mounted within the housing between the pair of electrical contacts wherein the pair of contacts are inserted into a receptacle and the plunger actuated causing the ground contact to engage the receptacle and the corresponding circuit breaker to trip.

2. A circuit breaker locator in accordance with claim 1 wherein:
   the plunger includes an elongated stem having a handle mounted thereon at one end of said stem outside the cover,
   a transverse plate extending across the housing and having a central aperture, the other end of the stem mounted within said aperture for reciprocal movement, and, a spring, mounted between the plate and the other end of the housing to maintain the ground contact in a retracted position within the housing, said ground contact being moved outwardly into a receptacle when the plunger is actuated.

3. A circuit breaker located in accordance with claim 2 further including:
   a light mounted on the housing end adjacent the plunger, said light being connected in parallel with the fuse and becoming operable if the circuit breaker associated with the outlet fails to trip and the fuse blows to indicate failure of the corresponding circuit breaker.

4. A circuit breaker locator in accordance with claim 2 wherein:
   the fuse has a rating substantially higher than the circuit breaker to which it is coupled so that the circuit breaker trips when the contacts are inserted into a receptacle thereby determining which circuit breaker is related to which outlet or alternatively the fuse fails indicating that the corresponding circuit breaker is inoperative.

5. A circuit breaker locator in accordance with claim 2 further including:
   a second housing having female receptacles at one end to engage the contacts on the end of the locator housing and a pair of leads extending outwardly from the other end of the second housing and having an alligator clip on the contacts.

6. A circuit breaker locator in accordance with claim 2 wherein:
   the fuse has a rating of approximately 50 amps.

* * * * *